(12) United States Patent
Wirz et al.

(10) Patent No.: US 6,621,157 B1
(45) Date of Patent: Sep. 16, 2003

(54) METHOD AND DEVICE FOR ENCAPSULATING AN ELECTRONIC COMPONENT IN PARTICULAR A SEMICONDUCTOR CHIP

(75) Inventors: Gustav Wirz, Berg (CH); Wolfgang Herbst, Konstanz/Egg (DE); Heinz Ritzmann, Berg (CH)

(73) Assignee: Alphasem AG, Berg (CH)

( * ) Notice: Subject to any disclaimer, the term of this patent is extended or adjusted under 35 U.S.C. 154(b) by 0 days.

(21) Appl. No.: 09/478,411

(22) Filed: Jan. 6, 2000

(30) Foreign Application Priority Data

Jan. 7, 1999 (EP) .............................. 99810009
Jul. 2, 1999 (EP) .............................. 99112660

(51) Int. Cl.⁷ .............................................. H01L 23/48
(52) U.S. Cl. ..................... 257/692; 257/787; 257/788; 257/789; 257/790; 257/795; 257/796; 257/797; 438/107; 156/60; 156/105; 156/145; 156/156; 156/241; 156/244; 156/273; 156/285; 156/358; 156/566
(58) Field of Search ...................... 257/787, 788, 257/789, 790, 795, 796, 797, 692; 438/107; 156/60, 105, 145, 156, 241, 244, 273, 285, 358, 566

(56) References Cited

U.S. PATENT DOCUMENTS

| 3,716,134 A | * | 2/1973 | Campbell ..................... 209/73 |
| 5,658,831 A | * | 8/1997 | Layton et al. ................. 29/832 |
| 5,659,952 A | | 8/1997 | Kovac et al. |
| 5,679,977 A | | 10/1997 | Khandros et al. |
| 5,719,443 A | * | 2/1998 | Messina ....................... 257/712 |
| 5,920,977 A | * | 7/1999 | Wyckoff et al. ............... 29/558 |
| 6,048,420 A | * | 4/2000 | Tuttle .......................... 156/3.5 |
| 6,071,371 A | * | 6/2000 | Leonard et al. ............. 156/297 |
| 6,137,183 A | * | 10/2000 | Sako ........................... 257/783 |
| 6,171,049 B1 | | 1/2001 | Wirz et al. |
| 6,200,504 B1 | * | 3/2001 | Peters .......................... 264/39 |
| 6,248,959 B1 | * | 6/2001 | Sylvester ..................... 174/256 |

FOREIGN PATENT DOCUMENTS

| JP | 09-219425 | * | 8/1997 | ................. 257/156 |
| JP | 10321679 | | 4/1998 | |

* cited by examiner

Primary Examiner—Jerome Jackson
Assistant Examiner—Edgardo Ortiz
(74) Attorney, Agent, or Firm—Shoemaker and Mattare

(57) ABSTRACT

For encapsulating an electronic component, in particular a semiconductor chip the component (3) at a distance is fastened onto a flat substrate (2). For this on the substrate there is deposited an elastomer layer (4, 9) which compensates the differing thermal expansion coefficients between the substrate and the component. A buffer material and/or an adhesive in liquid or pasty form is deposited from a dispenser and the component at room temperature is placed onto the buffer material and/or the adhesive. Before the final curing the buffer material and/or the adhesive is firstly subjected to a precuring. Subsequently the component by way of electrical leads is connected to contact locations on the substrate and lastly there is effected an encasing of all remaining hollow spaces including the electrical leads, with a protective mass.

17 Claims, 8 Drawing Sheets

Figure 1:
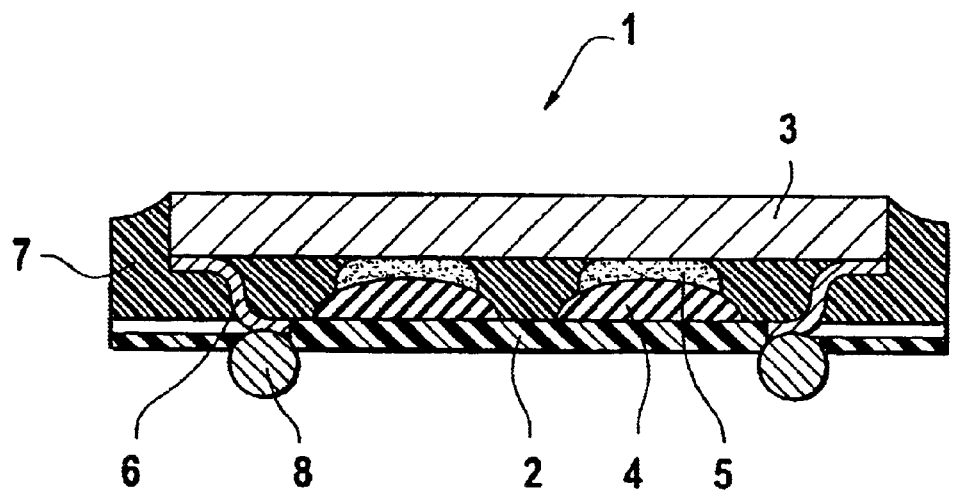

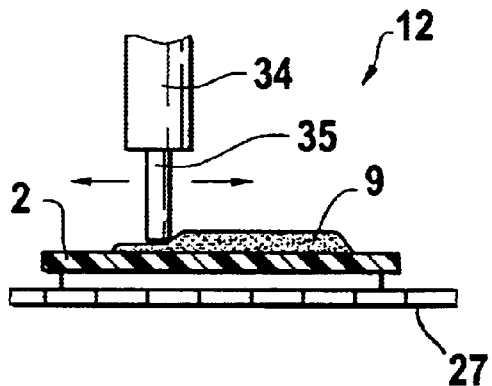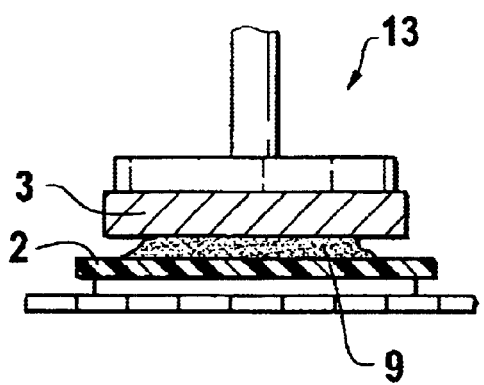
Fig. 4a  Fig. 4b
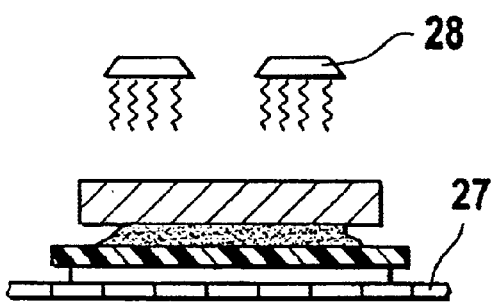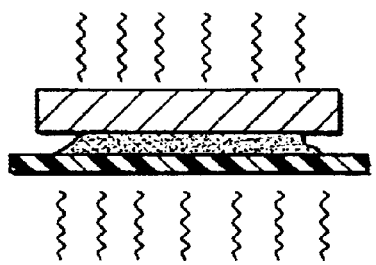
Fig. 4c  Fig. 4d
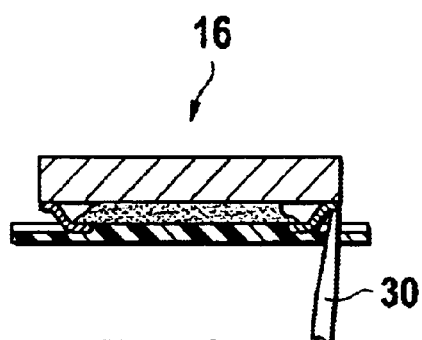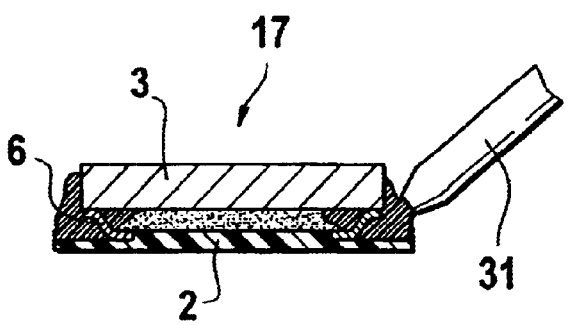
Fig. 4e  Fig. 4f

METHOD AND DEVICE FOR ENCAPSULATING AN ELECTRONIC COMPONENT IN PARTICULAR A SEMICONDUCTOR CHIP

The invention relates to a method for encapsulating an electronic component, in particular a semiconductor chip on a substrate. Such methods permit the manufacture of so-called chip scale packages (CSP) with which the completed semiconductor element provided with connection parts is only insignificantly larger than the bare silicon chip.

With this the basic idea lies in that between the substrate and the component there is arranged a buffer mass, for example of a silicone elastomer, which compensates the coefficient of thermal expansion differences of the materials. With this also the soldered connections of the installed semiconductor chip are only subjected to slight stress during environmental temperature fluctuations. The life duration and reliability of such chip scale packages is thus relatively high. Known manufacturing methods are for example described in "Semiconductor International", November 1997, page 48, or in U.S. Pat. No. 5,659,952 or U.S. Pat. No. 5,679,977. In spite of the improved properties of the end product, the known methods are however relatively complicated and do not permit an efficient manufacture. In particular there are necessary numerous individual steps with a comparatively high cost with respect to required apparatus and time required for manufacture. It is therefore an object of the invention to provide a method of the above mentioned type with which fewer processing steps are required. Furthermore with the placing of the component onto mechanical installation parts and/or onto the component itself there is to be effected no unnecessary exposure to heat because micromechanical processes with a simultaneous heat effect are difficult to handle and may tend to degrade the electronic component.

This object according to the invention is achieved with a method in which the buffer material and/or an adhesive in a liquid or pasty (flowable form is deposited from a dispenser onto a substrate. With this at least one working step which was necessary until now may be saved, specifically the pressing on of an adhesive in a stencil printing method. The component itself is at room temperature placed onto the buffer material and/or onto the adhesive and not as previously in the heated condition. With this the term "room temperature" is to be understood as a temperature which prevails in working rooms corresponding to the applicable standards in air conditioning technology and which settle roughly in the temperature range from 10° C. to 45° C., preferably from 16° C. to 26° C. With this the throughput per unit of time is improved since no heating time for the component is required. Mechanical installation parts and/or measuring instruments are not compromised by the effect of heat.

After the placing-on of the component the buffer material and/or the adhesive may be subjected to a precuring and a curing and specifically advantageously on the same installation as the placing-on of the component. By way of this in a particularly advantageous manner there is exploited the condition that with the adhesives applied here, the joining together of the parts to be connected and the curing of the adhesive do not necessarily have to coincide. By way of the temporal separation, the precuring and/or the curing may be effected in an installation region at which heat development is less problematic. After the precuring or curing the connected units without risk of a mutual displacement of the substrate and component may be transported to any other working station.

An essential process simplification may be achieved in that firstly several buffer cams or nubbins are applied to a substrate such as in a stencil printing method, the buffer cams are cured. Before the placing-on of the component, adhesive is deposited with the dispenser on or next to various buffer cams. With this method existing stencil printers for depositing the buffer cams (nubbins) may be used. In contrast the despositing of the adhesive is effected in a considerably more simple manner with the dispenser. Advantageously adhesive is deposited simultaneously from several dispenser openings, each to one of a plurality of nubbins. Under certain circumstances a dispenser, which in rapid succession coats a group of buffer cams with an adhesive would however also be conceivable.

With a suitable material choice the dispenser may be used to deposit the buffer cams may be deposited onto the substrate and be secured thereto. Subsequently each buffer cam may be provided with an adhesive layer. This may either be effected with a separate dispenser or with the same dispenser.

A further essential simplification of the process may finally be achieved in that an adhesive material may be applied that simultaneously serves as a buffer material. With this the subdividing into two separate materials is done away with, which simplifies the procedure as a whole. The adhesive may with this be deposited in the form of individual buffer bodies, which remain alone after the placing-on of the component. Subsequently, the voids are together with the covering of the wiring locations, filled out with a protective mass. Alternatively however it is also conceivable that the adhesive, with the dispenser, is deposited as an adhesive pattern which after placing on the component connects to a homogeneous layer between the component and the substrate. Air pockets are thus prevented and a retrospective filling out of the voids is no longer necessary. Such adhesive patterns are already known in semiconductor encapsulation technology.

Further advantages may be achieved when the depositing of the buffer material and/or of the adhesive, with the dispenser, is effected directly shortly before the placing on of the component at the same machine. Advantageously with this also the substrate, on the same transport system, is led past the dispenser and the placing-on device for the component. On the one hand with this both working steps may be exactly matched to one another and the drying or curing time may be better controlled. In the same machine and on the same transport system a smooth transport is possible, by which means the danger of an inadvertent displacement of the component from the nominal position is greatly reduced. Before the placing on the component is advantageously adjusted with respect to position.

An improvement of the planarity of the component and the substrate may be achieved in that during the placing on of the component the substrate is secured on a rest surface by way of a vacuum.

For improving the manufacturing rationality advantageously groups of components are fastened on the same substrate. For this in each case several components after one another are deposited to a group. The whole group may then simultaneously be subjected to a pressing-on pressure and/or to a heat treatment. This pressing on and/or heating in groups may also be applied with alternative encapsulation processes in which the components are not deposited at room temperature. The simultaneous processing of the components may be effected via commonly actuated individual tools, such as e.g. individual pressing punches, which however are actuated simultaneously. Alternatively it may also however be the case of a common tool which impinges the whole group simultaneously, such as e.g. a common pressing punch of a suitable size.

Generally, in order to ensure an adequate adhesion and to cure the elastomer mass, the components with the simultaneous heating must be pressed against the substrate.

A disadvantage of the known method lies however in the fact that the exact placing of the components on the substrate and the final connection under a high pressure and at a high temperature is effected in one step. The pressing procedure with this lasts considerably longer that the placing procedure which leads to great capacity reductions in the production line. On the other hand however the application of high temperatures in the region of the placing of the components is disturbing in that the heat may damage the component or the adhesive materials. At the placing station, specifically highly precise manipulators and measuring apparatus operate, which react sensitively to temperature effects. It is therefore a further object of the invention to provide a method of the previously mentioned type with which, with simple means, the production capacity within the same line may be increased. Furthermore the method is to permit a separation of the placing-on procedure from the actual processing procedure for the definitive connection.

This object, according to the invention, is achieved with a method which In which the pressing in groups and/or heating of the components is with this effected separately with respect to time from the placing-on procedure so that according to the tool size a relatively large number of components may be simultaneously treated.

With this, the placing of the components onto the substrate and the impinging with the tool at spaced working stations are effected particularly advantageously. Specifically it has been shown that the exact placing and the processing do not necessarily have to be effected at the same working station. With the application of suitable substrates and adhesives it is possible to achieve adequate adhesive force at room temperature for the further transport after the placing. With this the substrates may be transported away from the sensitive placing region to a processing station at which without negative influence to the placing procedure, pressure and/or heat may be applied.

Several groups of components after one another may with this in a cycled manner be impinged, wherein the impingement of a group in the ideal case lasts maximally for as long as the placing-on of a preceding group. With the placing-on procedure with this in a rapid succession the components may be arranged to a group, wherein at the processing station during the whole time duration from the placing of the first component up to the placing of the last component one presses. Considerable advantages with the processing of the components may further be achieved when each component is impinged with a separate plunger and when with the impinging for achieving a uniform bearing force on all components each plunger is adapted to the individual height of the component. With this measure it is ensured that also with the unavoidable height tolerances of the component a uniform processing of the whole group with pressure and temperature is effected. A component with a maximum height which is only just allowable will thus be subjected to the same pressing force and to the same temperature as a component with an allowable minimum height.

For the heat treatment before or during the impingement of the components the plunger and/or a substrate rest serving as a support are heated. It would however also be conceivable to carry out the whole pressing procedure in a closed oven or to effect the heating in another manner, e.g. by way of a convection oven or by microwaves. The substrate is furthermore during the impingement of the components advantageously held on the substrate rest by way of a vacuum. Since with the substrate it is usually the case of a film-like or gel-like material, with this also a flat lying on the substrate rest is ensured without air pockets.

The invention also relates to a device for carrying out the described method. With slight constructional adaptations with this advantageously known equipping automatic machines (die bonders) may be applied, as is known e.g. by way of WO 97/32460, the contents of which are hereby incorporated herein in its entirety.

The dispensing station may comprise a dispenser with several delivery openings or however a dispenser with at least one movable dispenser opening with whose help by way of a simultaneous movement and delivery of the means a certain pattern is drawn.

A particularly compact manufacturing unit may be achieved when in the transport direction after the placing-on station there is arranged a precuring station and/or a curing station in which the unit consisting of the substrate and component is impingable by way of electromagnetic rays, in particular by way of infrared rays or ultra-violet rays. The semiconductor components may run through this precuring station or curing station in the same operating cycle as the dispensing station and placing-on station.

The invention also relates to a device for processing components arranged on a substrate, in particular semiconductor chips. This device is particularly suitable for carrying out the method according to the invention, but may also be applied in other manners. The device in particular is to ensure that in spite of the processing of the components in a group, the individual nature of each component is taken account of as with an individual processing.

The individual and displaceably mounted plungers in the tool permit each individual component of a group to be processed individually. Conceivable therefore would be the exertion of an individual pressing force and/or an individual temperature. The individual plungers may be shaped differently so that within a group various sizes and shapes of components may be impinged.

With the above mentioned manufacture of semiconductor elements however as a rule only the differing heights of the raw silicon chips need be taken into account. This is preferably effected in that the plungers are in active connection with a compensation means. This compensation means may function according to differing technical principles. Thus for example a purely mechanical solution would be conceivable, with which in a neutral home position of the tool the displaceable plungers are applied loosely onto the components. Via a central locking then all plungers are locked in their sliding bearing whereupon via the tool the pressing force is exerted via the individually adjusted plungers. It would however also be conceivable to allocate to each individual plunger a pressure means cylinder whose allowable inner pressure may be individually controlled.

In a particularly simple manner the compensation means however is formed by a fluid chamber or manifold for the hydrostatic distribution of an equal impingement force onto the individual plungers. The fluid chamber functions according to the known principle, according to which in a practically non-compressible still fluid, the pressure forces propagate independent of direction. With this each of the plungers could with an equal impingement surface submerse into the fluid chamber whose walls are otherwise rigid.

A technically considerably more simple solution lies in arranging the fluid chamber on the rear side, of the plunger, which is distant to the substrate rest and for it to comprise a flexible membrane, wherein the rear sides of the plunger bear on the membrane. The volume in the chamber always remains the same size, independently of how the plungers are positioned. With this the elasticity of the membrane within a certain tolerance region permits a displacement of the plungers. The pressure in the fluid and thus the pressure on the individual plungers with this however remain constantly equal.

For monitoring and control or where appropriate also for recording the pressing force acting on the plungers the fluid chamber may be in active connection with a pressure sensor. It is also with tools without fluid chambers generally advantageous to control the pressing pressure of the tools via a pressure sensor, in order to approximate the pressing force during the whole pressing duration to a nominal value. In particular pressure sensors, but also other sensors, e.g. force sensors may be applied.

The plungers could be mounted in a plunger guide, which for heating the plunger is provided with a heating device. The plungers may with this, indirectly via at least one heating device, be heated to process temperatures, for instance of up to 300° C. Preferably the plunger guide and the plunger consist of the same metallic material (or materials having compatible coefficients of thermal expansion) so that no jamming occurs with the thermic expansion. The plungers specifically must be guided in the plunger guide with a very small play so that exclusively vertical forces and no transverse forces act on the working surface of the plungers. For the same reason the plunger guides in relation to the diameter of the plungers are preferably formed relatively long.

In order to prevent the irradiation of heat or to protect the operating personnel, the tool at least partly may be surrounded by a heat-insulating layer. The same also applies to the substrate rest in the case that this is likewise heated by way of a heating device. So that also the operating temperature may be monitored and controlled in the tool as well as in the substrate rest there is arranged at least one temperature sensor.

For safety reasons the plungers in the idle condition of the tool are biased into a neutral home position in which they are preferably completely retracted into the tool. In this manner the plungers may not be damaged when the tool for example for re-equipping work is removed from the tool mounting. Furthermore it is thus ensured that the plunger rear sides in the home position bear uniformly on the membrane of the fluid chamber. Finally with the spring biasing it is also preferably ensured that the plungers for the optimal heat accommodation after each operating stroke again completely submerge into the plunger guide.

The substrate rest rests preferably on an adjustable three-legged stand. By way of this the substrate rest in a particularly simple manner may be aligned plane-parallel onto the working plane of the plungers. Also this measure serves the prevention of transverse forces acting on the components.

The device may in particular be used for re-pressing the chips in a line for manufacturing chip scale packages (CSP), in particular ball grid arrays (BGA) or flex BGA's. With the same devices however also other processings in semiconductor manufacture may be carried out. Thus for example in the field of flip chips, wherein the chips are adhered with bumps, are eutectically fastened or are soldered. The device is however also suitable for LOC processes (lead on chip) with which the connection between the chips and a metallic lead frame is manufactured under pressure and temperature.

Finally it would however also be conceivable to apply the device according to the invention also outside semiconductor technology, for example in the field of electrotechnology or opto-technology.

Figure 2:
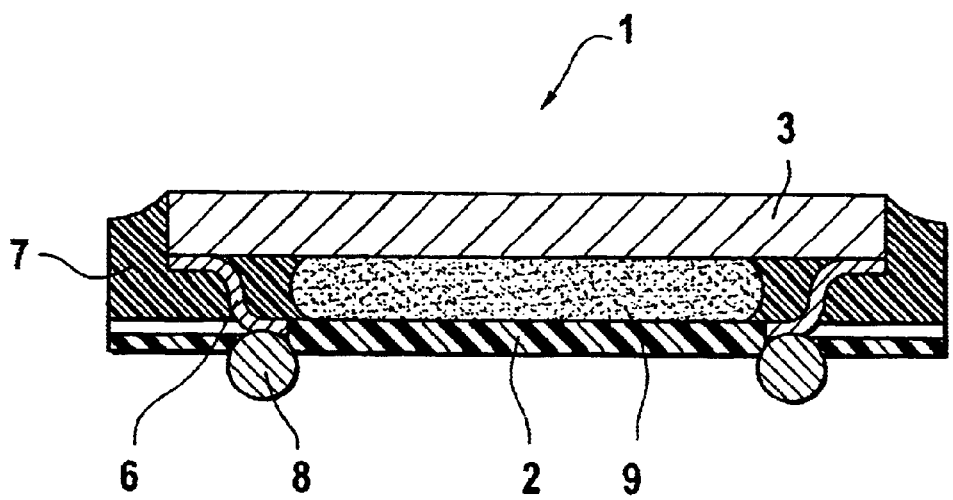
Figure 5:
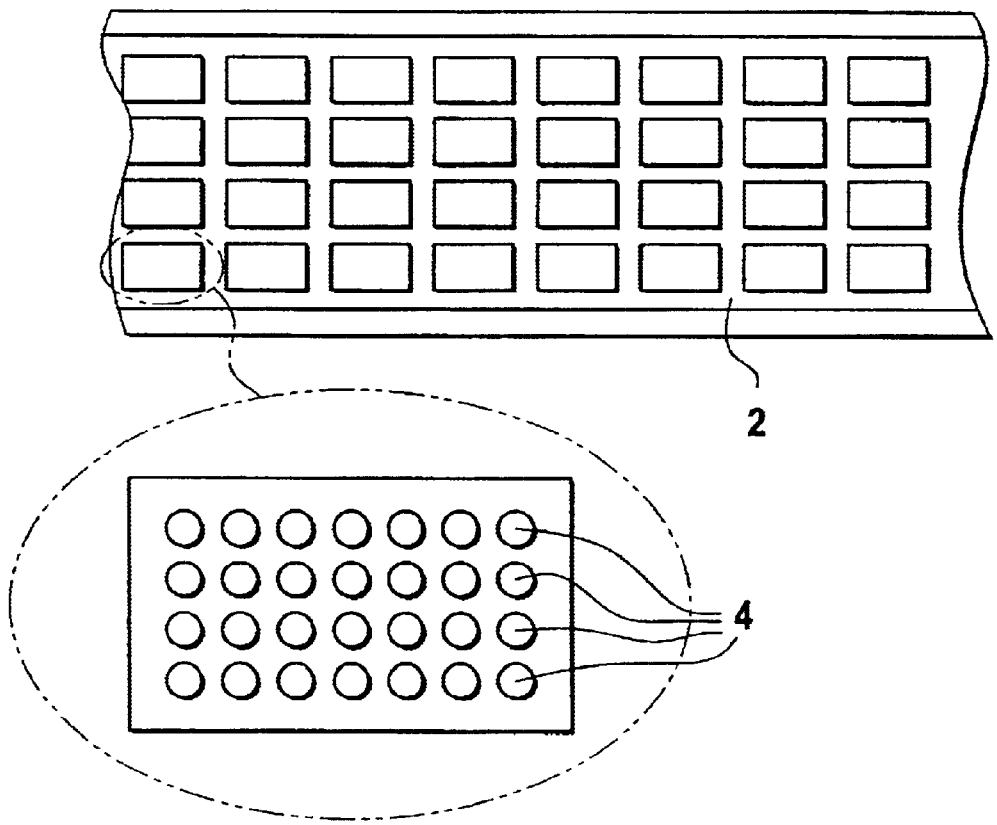
Figure 6:
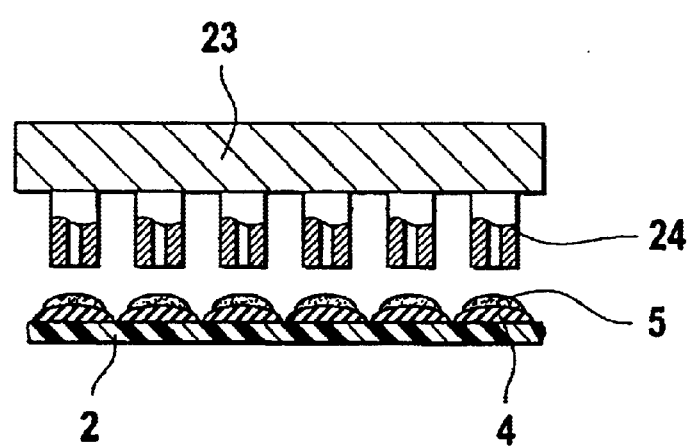
Figure 7:
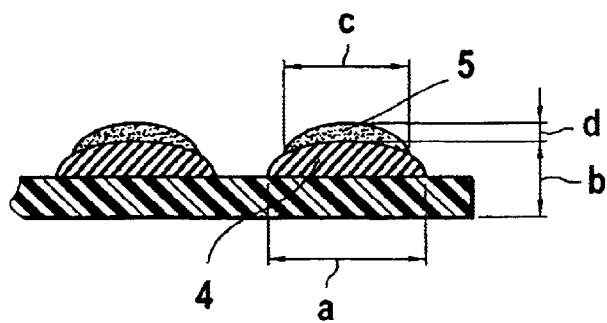
Figure 8:
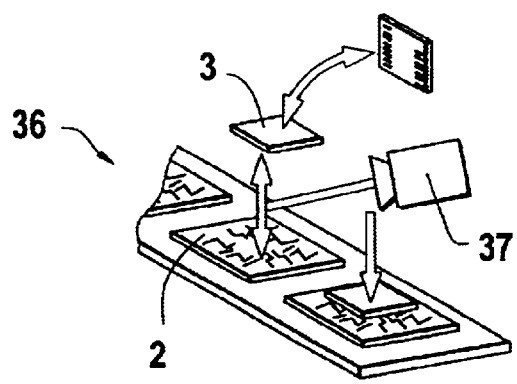
Figure 9:
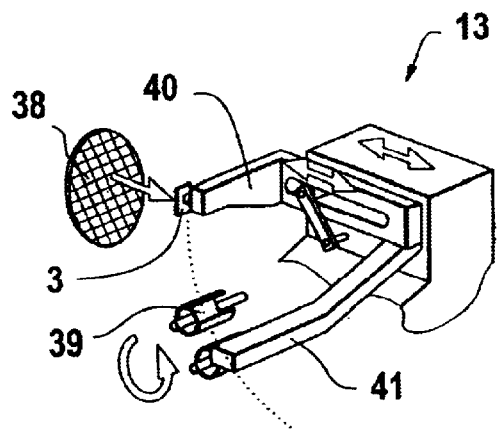
Figure 10:
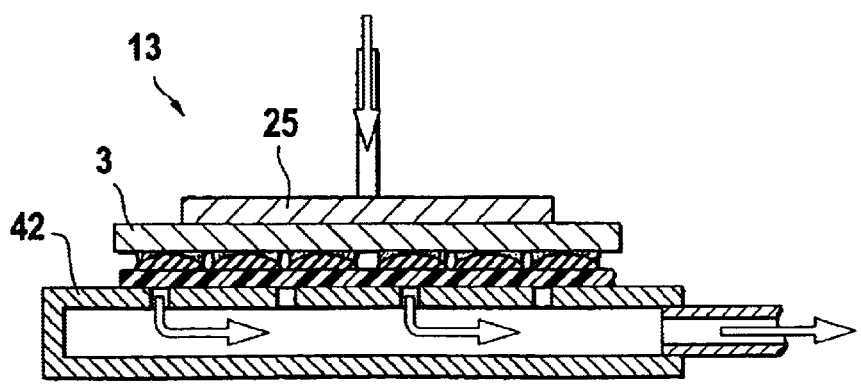
Figure 11:
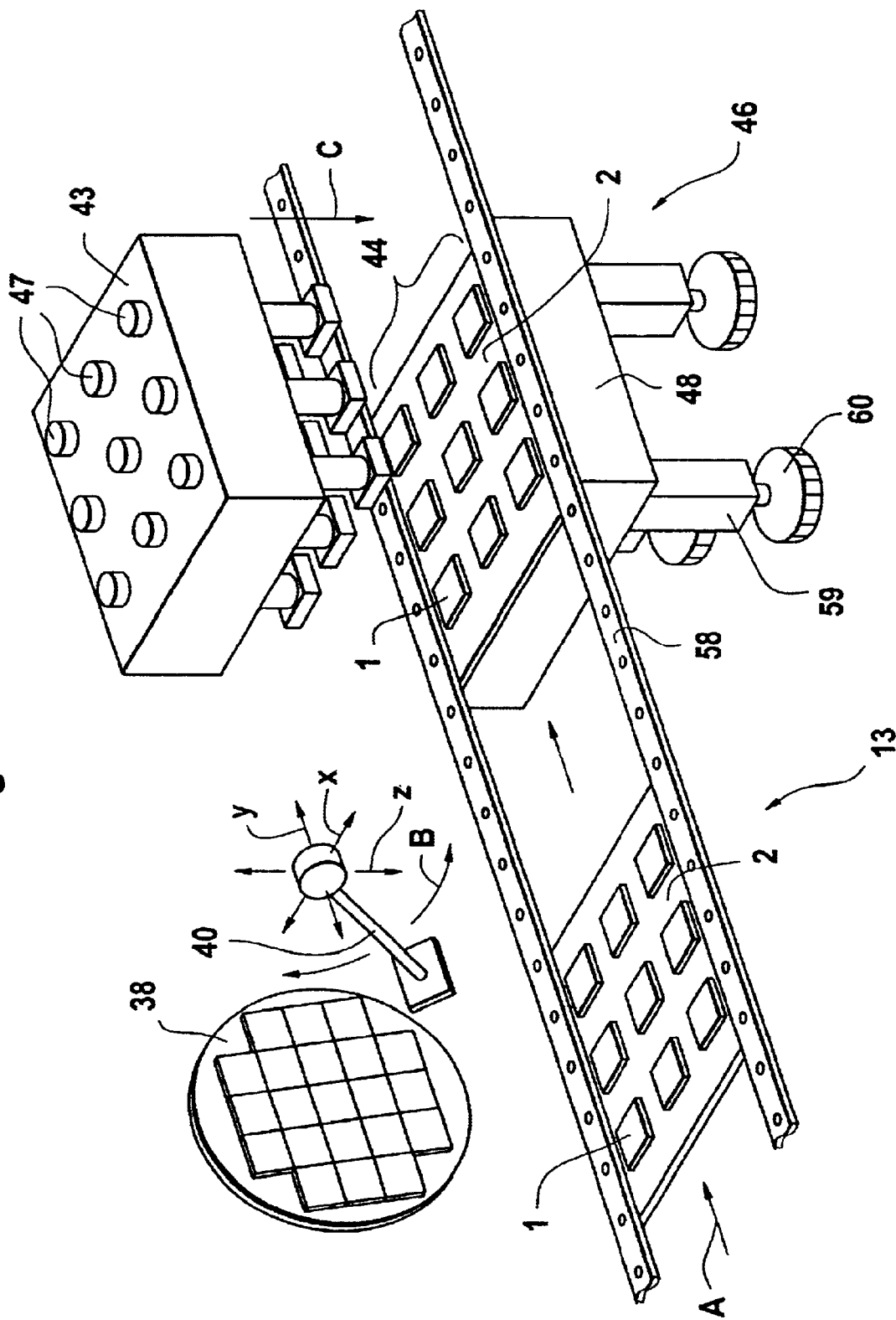
Figure 12:
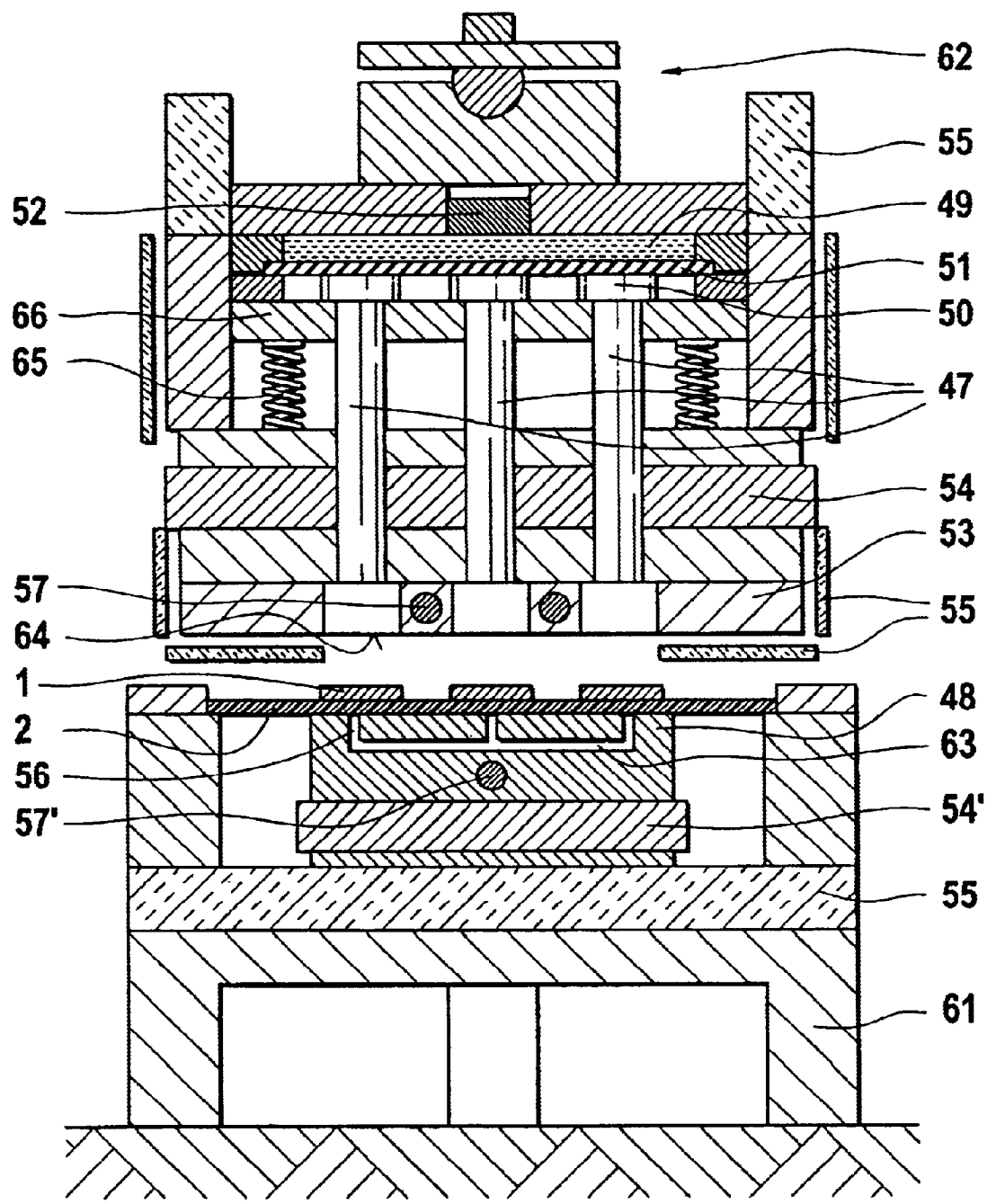
Figure 13:
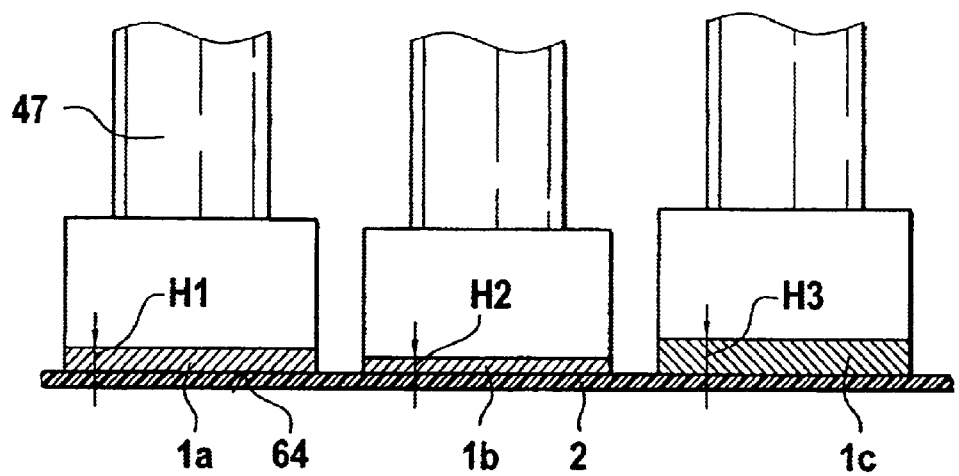
Figure 14:
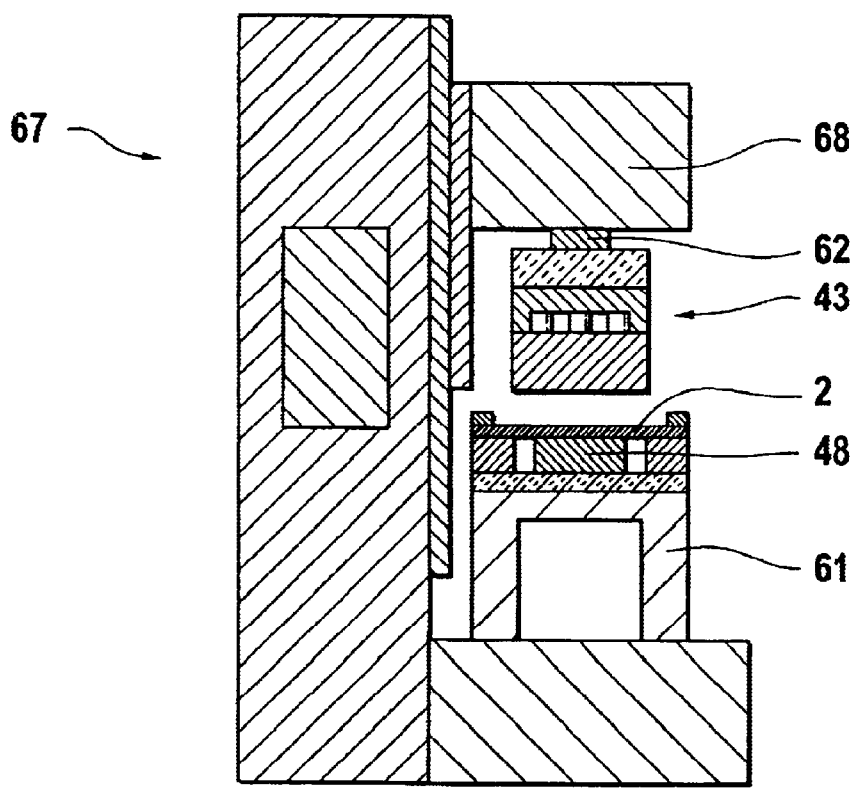

Further advantages and individual features of the invention result from the subsequent description and from the drawings. There are shown:

FIG. 1 a cross section through an exemplar chip scale package with individual buffer cams, FIG. 2 a cross section through an exemplar chip scale package with a homogeneous buffer layer, FIG. 3 a first manufacturing method according to the present invention in schematic individual representations, FIG. 4 a second manufacturing method according to the present invention in schematic individual representations, FIG. 5 a plan view of a substrate with a group of deposition positions for components, FIG. 6 a schematic representation of a needle dispenser with several delivery openings, FIG. 7 greatly enlarged buffer cams with an adhesive layer, in a lateral view, FIG. 8 the schematic representation of an adjusting station, FIG. 9 the schematic representation of a placing-on station, FIG. 10 a schematic representation of a placing-on procedure, FIG. 11 a heavily simplified perspective representation of a treatment method, FIG. 12 a schematic representation of a treatment device, FIG. 13 a cross section through a group of components with a differing constructional size, and FIG. 14 a schematic whole representation of the device according to FIG. 2 in a press.

By way of the FIGS. 1 and 2 the principle construction of a chip scale package 1 in two variations is described according to the present invention. With the embodiment example according to FIG. 1 a preferably flexible substrate 2 of plastic material, e.g. polyimide foil is provided with a multitude of elastic buffer cams or nubbins 4. These consist for example of a silicone elastomer. Onto these buffer cams with the help of an adhesive 5 a silicon chip 3 is fastened. On the free remaining rear side of the substrate 2 contact locations in the form of solder balls 8 are arranged. These are wired to the chip 3 via electronic leads 6. All hollow spaces between the buffer cams 4 as well as the region around the electrical leads 6 are filled out with a protective mass 7, also known as an underfill layer, for example of plastic material. The attachment and connection of the electrical leads, the fastening of the solder balls and also the filling out of the voids per se is already known to the man skilled in the art and in the following is not described in more detail. In this context, Lawing "Preventing voids in BGA® packages" in Chip Scale Review, March 1998 is referred to and the contents thereof incorporated herein by reference in its entirety. Useable silicone elastomers are for example manufactured by the company Dow Corning, Midland, Mich. USA, specifically under the description Dow Corning 7910 for the adhesive, Dow Corning 6910 for the buffer material and Dow Corning 6811 for the protective mass or underfill material.

With the embodiment example according to FIG. 2 the chip scale package 1 from the outside practically does not differ from that according to FIG. 1. Instead of individual buffer cams however a homogeneous adhesive layer 9 assumes the function of the buffer material and of the distance retainer. After connecting the electrical leads 6 these must yet only be encapsulated in the outer region with the protective mass or underfill 7. The danger of damaging influences of humidity by way of this is greatly reduced.

Figure 3A:
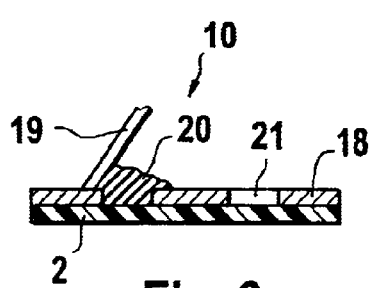

The manufacturing method represented schematically in FIGS. 3a–3h shows the essential working stations, whose function is subsequently explained. In FIG. 3a at a printing station 10 with the help of a stencil printing method individual buffer cams are printed onto the substrate 2. For this purpose a stencil 18 is pressed against the substrate which is provided with openings 21. A buffer mass 20 is pressed with a blade 19 into the openings by which means the individual buffer cams are formed. Of course, other methods of depositing the nubbin material may be devised as is found advantageous.

Figure 3B:
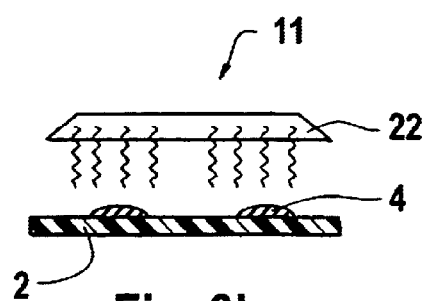
Figure 3C:
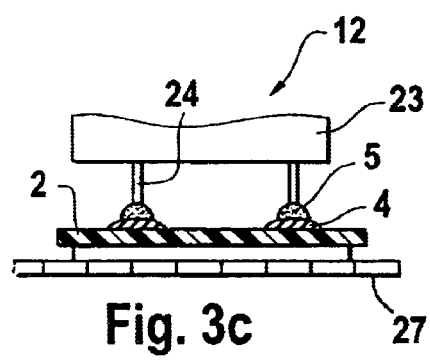

The freshly formed buffer cams 4 are according to FIG. 3b cured at a first curing station 11 with a heat source 22.

Such a prepared substrate now on a transport system 27 gets into a machine 26 in which next to one another there are arranged a dispensing station 12, a placing-on station 13 and where appropriate yet also a precuring station 14 and/or a curing station 15. At the dispensing station 12 according to FIG. 3c, with a needle dispenser 23, from several tubelets 24 simultaneously an adhesive 5 is deposited onto each buffer cam 4. With this an adhesive is selected with whose help one may adhere at room temperature.

Figure 3D:
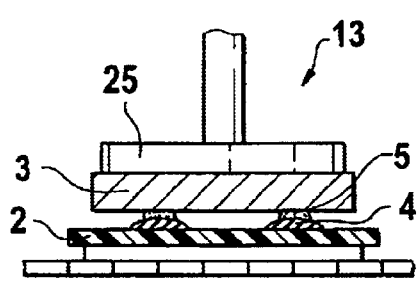
Figure 3E:
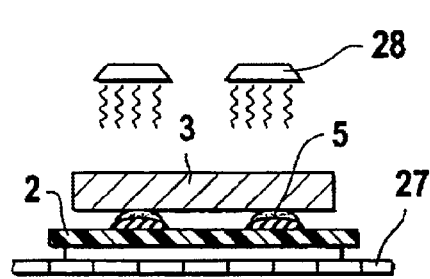

On the placing-on station 13 according to FIG. 3d the chip 3 with the placing-on head 25 is deposited onto the coated buffer cams 4. After a smooth, jerk-free careful further transport to the precuring station 14 according to FIG. 3e there is effected a precuring, preferably with the help of infrared irradiators 28 which irradiate the substrate 2 from above.

Figure 3F:
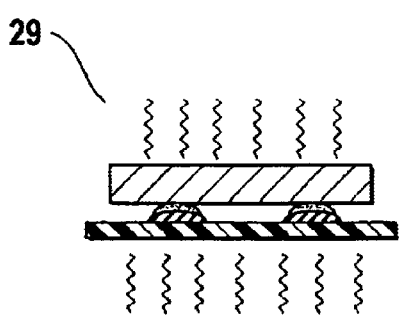

Only after this precuring, according to FIG. 3f, the whole unit is cured at a precuring station 15 with an oven 29 at a temperature of for example 150° C.

Instead of the precuring station however also there may be directly the final curing station. Both stations, thus the precuring station and/or the curing station could in certain cases also be separate installation parts which are not run through by the same transport system.

Figure 3G:
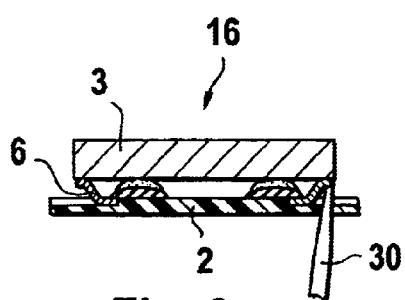

Subsequently according to FIG. 3g at a connection station 16 the electrical leads 6 are connected with a connection tool 30 onto the chip 3. This process (lead bonding) is already known to the man skilled in the art per se.

Figure 3H:
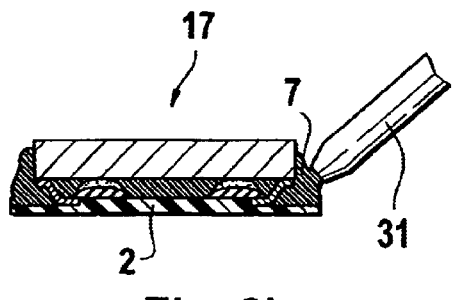

Finally according to FIG. 3h there is effected the encapsulation of the whole unit on a encapsulation station 17 with a protective mass 7 which is delivered from a filling tool 31. With this the hollow spaces between the individual buffer cams 4 and also the wirings are filled out or encased.

The manufacturing method according to FIG. 4 functions without the formation of buffer cams. In contrast at the dispensing station 12 according to FIG. 4a an adhesive 9 is deposited onto the substrate 2 which simultaneously assumes the function of a buffer mass. The deposition is effected with the help of a movement dispenser 34 which from a single needle 35 may draw a certain adhesive pattern, for example a cross or a star, onto the substrate 2.

Instead of a linear pattern also individual surfaces may be deposited. Instead of a single needle also a tool with multiple openings may be applied.

At the placing-on station 13 the chip is placed onto the adhesive 9 and with a slight force is placed against the substrate 2 so that the previously drawn adhesive pattern with the displacement of air forms a homogeneous layer.

Precuring and/or curing are effected in turn in the same manner as with the previous embodiment example. Also the wiring at the station 16 is the same.

At the encapsulation station 17 a protective mass 17 is likewise applied. This however must only coat the electrical leads 6 and the side edges of the chip 3. If the buffer layer is not homogeneous but is subdivided into individual sections, at the encapsulation section 17 however also these hollow spaces must be filled out. Finally it is yet to be pointed out that the wiring locations may not be required to be arranged in the outer region of the components 3. Also a wiring within the surface of the components is in practice possible.

FIG. 5 illustrates the arrangement of a group of placing-on positions on a substrate 2. Each position is provided with a multitude of buffer cams 4. Such a field of buffer cams is in each case coated simultaneously with adhesive 5 with the needle dispenser according to FIG. 6 or in another manner.

FIG. 7 illustrates the size ratios for example at the buffer cams. Accordingly the diameter a in the shoulder region is for example 450 m and the maximum height b is 150 m. The adhesive layer 5 has a height d and a maximum diameter c of approx. 350 to 450 m, is thus preferably somewhat smaller than the surface of the buffer cam.

FIG. 8 shows schematically.an adjustment station 36 which may be directly applied to the placing-on station 13. With this with the help of adjusting optics 37 the chip 3 is aligned exactly on the substrate 2 lying thereunder, before or after it is deposited.

FIG. 9 shows schematically the rotational movement of a chip 3 between the removal of the wafer 38 and the placing onto the substrate. A receiving arm 40 moves the chip from the wafer 38 to a rotary holder 39. Here the chip is turned round and in the next working cycle is again received by a delivery arm 41 and with the rear side again deposited against the substrate. This method and apparatus are disclosed in copending U.S. patent application Ser. No. 09/117113 entitled "A Method and Device for Receiving, Orientating and Assembling Components" and commonly assigned to the assignee of the present application, the contents of which are incorporated herein by reference in its entirety.

FIG. 10 shows schematically how with the depositing of the chip at the placing-on station the substrate 2 by way of vacuum may be fixed onto a vacuum rest 42. The vacuum rest is provided with openings which lead to a vacuum chamber. Here there prevails a pressure lying below atmospheric pressure.

FIG. 11 shows a portion of a manufacturing line for the manufacture of semiconductor elements. With this there is represented a placing-on station 13 and a repressing station 46, which however both may be a part of the same installation. On a substrate advance 58 by way of suitable advance means, not shown in more detail here, a substrate 2 is displaced forwards in the arrow direction A. With the substrate it may with this be the case of a polyimide film which at a previous working station is coated over a large surface with an adhesive material.

At the placing-on station, with means known per se, for example with a conventional die bonder, silicon chips 1 are deposited onto the substrate 2. The chips with the help of a receiving arm 40 are removed from a wafer 38 and placed. The receiving arm with this swings to and from in the arrow direction B and it may furthermore be moved in the three various spacial axes x, y, z. With this also a turning of the relative position of the chip and the wafer and the substrate is possible (flip chip).

As soon as at the placing-on station 13 a group 44 of chips 1, which is previously defined with respect to position, is deposited, the substrate is transported further to the repressing station 46. These chips with this may not displace with respect to position, although there does not yet exist an intensive connection to the substrate. A permanent connection is only achieved by the re-pressing and the heating with the help of a tool 43. With this processing the substrate 2 lies on a plane substrate rest 48. The tool 43 may in the arrow direction C be pressed plane-parallel against this substrate rest. To each individual chip 1 on the substrate 2 in the tool 43 there is allocated an individual plunger 47 which likewise is displaceably mounted in the arrow direction C. The substrate rest 48 stands on a three-legged stand 59 whose relative position may be set with adjusting screws 60. This adjusting possibility permits a plane-parallel adaptation to the working surface of the plunger. The adjusting procedure may also be automated with the help of means known per se.

The tool 43 is during a certain pressing time pressed against the substrate rest 48, wherein via the plunger 47 or via the substrate rest simultaneously the adhesive is cured by heating. During this pressing time at the placing-on station 13 in turn a new group of chips is deposited onto a new substrate.

Further details of the re-pressing station 46 are viewable from FIG. 12. The substrate rest 48 rests on a machine frame 61. For fixing the substrate 2 in an exactly defined pressing position there are provided suction openings 56 which via a suction conduit 63 are connectable to a vacuum source (not shown). The substrate rest may be heated by way of an incorporated heating cartridge 54'. For the temperature control there serves a temperature sensor 57'. In order to prevent heat losses the substrate rest is shielded with respect to the machine frame by a heat insulation 55.

The tool 43 by way of a tool mounting 62 may be tensioned into the extension arm 68 of a conventional press 67 (FIG. 14). The tool has a plunger guide 53 in which the individual plungers 47 are displaceably mounted in an axis-parallel manner. Beyond all plunger rear sides 50 there extends a fluid chamber 49 which is sealed with respect to the plungers by a flexible membrane 51. The plunger rear sides are pressed against the membrane under the biasing of compression springs 65 with the help of a driver plate 66. In this home position the plunger end-face sides 64 are furthermore retracted into the tool 43 or they run roughly in the same plane as the underside of the plunger guide 53.

The fluid chamber 49 is in active connection with a pressure sensor 52. Furthermore temperature sensors 57 are also arranged on the plunger guide 53. The heating of the plunger guide and thus of the plungers 47 mounted therein is effected likewise via at least one heating cartridge 54. Likewise the tool is covered as closed as possible with a heat-insulating layer 55.

The acting manner of the fluid chamber 49 is represented by way of FIG. 13. On the substrate next to one another there are arranged three chips 1a, 1b, and 1c. The chip 1a has with this the predetermined nominal construction height H1 whilst the chip 1b the minimum constructional height H2 and the chip 1c the maximal constructional height H3. If these three chips are pressed with the same pressing plate plane-parallel to the substrate rest 48 then the pressing plate would evidently load chip 1c the most and possibly damage it, whereas the chip 1b possibly would not be loaded at all. According to the invention however each plunger as a result of its displaceability may adapt to the constructional height of the chip, whilst by way of the bearing on the flexible membrane 51 a uniform pressing force distribution is ensured. According to the press, per plunger a pressing force of up to 9 bar may be exerted.

What is claimed is:

1. A method for processing electronic components on a substrate, said method comprising steps of
   placing a substrate on a substrate rest,
   placing a plurality of the components onto the substrate, and
   pressing the components against the substrate by moving a tool arrangement comprising a guide and a plurality of independent parallel plungers supported by the guide toward the rest so that the plungers contact respective ones of said components and press them independently against the substrate, while
   maintaining a uniform bearing force on all the components.

2. A method according to claim 1, wherein the step of simultaneous pressure and/or heat treatment of the plurality of components is effected with simultaneously actuated individual tools for each components.

3. A method according to claim 1, wherein the step of simultaneous pressure and/or heat treatment of the plurality of components is effected with simultaneously with a common tool.

4. A method according to claim 1, wherein the step of placing of the plurality of components onto the substrate and the step of impinging on the components with the tool is effected at separate spaced locations.

5. A method according to claim 4, wherein during the impingement of the components at least one of the plungers and the substrate rest are heated to a desired temperature.

6. A device for pressing a plurality of electronic components onto a common substrate, said device comprising
   a rest for supporting the substrate,
   a tool arrangement which is mounted over the rest and can move in a direction toward the rest, said tool arrangement comprising a plunger guide, and
   a plurality of independent plungers for pressing respective ones of said components against the substrate, said plungers being displaceably mounted in the plunger guide on parallel axes, said plungers being moveable relative to one another in the same direction as the tool arrangement.

7. A device for pressing a plurality of electronic components onto a common substrate, said device comprising
   a rest for supporting the substrate,
   a tool arrangement which is mounted over the rest and can move in a direction toward the rest, said tool arrangement comprising a plunger guide,
   a plurality of independent plungers for pressing respective ones of said components against the substrate, said plungers being displaceably mounted in the plunger guide on parallel axes in the plunger guide, and being relatively moveable in the same direction as the tool arrangement, and
   compensation means for applying equal force to all of the plungers regardless of thickness differences between the components.

8. A device according to claim 7, wherein the compensation means is a fluid chamber for the hydrostatic distribution of the impingement force onto the individual plungers.

9. A device according to claim 8, wherein the fluid chamber is arranged on the rear sides of the plungers, which are spaced from the substrate rest, and the fluid chamber comprises a flexible membrane, with the rear sides of the plungers bearing against the membrane.

10. A device according to claim 6, wherein the plungers are mounted in a plunger guide which is provided with a heating device for heating the plungers when in contact with the components.

11. A device according to claim 10, wherein the plungers and the plunger guide are made of materials having compatible coefficients of thermal expansion and the heating device comprises an electrical heating cartridge.

12. A device according to claim 10, wherein the tool is at least partly surrounded by a heat-insulating layer.

13. A device according to claim 6, further comprising temperature sensors in both the tool and the substrate rest for monitoring the treatment temperature.

14. A device according to claim 6, wherein in the idle condition of the tool, the plungers are biased toward a neutral home position in which they are retracted into the tool.

15. A device according to claim 6, further including means for adjusting the plane-parallel alignment of the substrate rest to a plane defined by the plungers.

16. A device according to claim 6, wherein the impingement force of the tool is controllable via a sensor mounted on the tool, in particular a pressure sensor.

17. A device according to claim 8, wherein a pressure sensor is in active connection with the fluid chamber for the control of the impingement force of the tool.

* * * * *